(12) United States Patent
Komaki

(10) Patent No.: US 6,794,898 B2
(45) Date of Patent: Sep. 21, 2004

(54) SCAN FLIP-FLOP CIRCUIT, SCAN FLIP-FLOP CIRCUIT ARRAY, AND INTEGRATED CIRCUIT DEVICE

(75) Inventor: Masaki Komaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 71 days.

(21) Appl. No.: 10/358,224

(22) Filed: Feb. 5, 2003

(65) Prior Publication Data

US 2003/0222677 A1 Dec. 4, 2003

(30) Foreign Application Priority Data

May 29, 2002 (JP) ........................................ 2002-156225

(51) Int. Cl.[7] .............................................. H03K 19/173
(52) U.S. Cl. .............................. 326/46; 326/93; 326/29; 326/62
(58) Field of Search .............................. 326/46, 29, 62, 326/93

(56) References Cited

U.S. PATENT DOCUMENTS 6,593,773 B2 * 7/2003 Staszewski et al. ........... 326/46
6,628,141 B1 * 9/2003 Alt et al. ....................... 326/46
6,670,826 B1 * 12/2003 Bauer ............................ 326/46
6,696,857 B1 * 2/2004 Rana ............................. 326/46
6,703,862 B1 * 3/2004 Bilski ........................... 326/46
6,717,437 B2 * 4/2004 Hemmert et al. ............. 326/46

FOREIGN PATENT DOCUMENTS

| JP | 2000-180510 | 6/2000 |
| JP | 2001-201542 | 7/2001 |
| JP | 2001-305180 | 10/2001 |

* cited by examiner

Primary Examiner—Michael Tokar
Assistant Examiner—Lam T. Mai
(74) Attorney, Agent, or Firm—Arent Fox PLLC

(57) ABSTRACT

A scan flip-flop circuit achieving higher operation speed, lower power consumption, and a simplified selector section, an array of the scan flip-flop circuits, and an integrated circuit device having therein the array are provided. In a scan flip-flop circuit, an output terminal is provided in addition to an output terminal. One of the output terminals is used for a logic circuit and the other output terminal is used for a scan flip-flop circuit of the next stage. At the output terminal for the scan flip-flop circuit 1 of the next stage, an output is fixed in a normal operation, thereby achieving higher operation speed in the normal operation and lower power consumption. A selector section can employ a relatively simple OR-AND-INVERTER structure.

18 Claims, 13 Drawing Sheets

SCAN FLIP-FLOP CIRCUIT DIRECTED TO FIRST EMBODIMENT

FIG.1 SCAN FLIP-FLOP CIRCUIT DIRECTED TO FIRST EMBODIMENT

FIG.2 USAGE EXAMPLE OF SCAN FLIP-FLOP CIRCUIT IN INTEGRATED CIRCUIT OF FIG.1

STRUCTURE OF SELECTER SECTION IN SCAN FLIP-FLOP CIRCUIT OF FIG.1

FIG.4 USAGE EXAMPLE (1) : BOTH SCAN FLIP-FLOP CIRCUIT OF FIG.1 AND CONVENTIONAL SCAN FLIP-FLOP CIRCUIT ARE USED IN INTEGRATED CIRCUIT

FIG.5 USAGE EXAMPLE (2): BOTH SCAN FLIP-FLOP CIRCUIT OF FIG.1 AND CONVENTIONAL SCAN FLIP-FLOP CIRCUIT ARE USED IN INTEGRATED CIRCUIT

FIG.6 SCAN FLIP-FLOP CIRCUIT DIRECTED TO SECOND EMBODIMENT

STRUCTURE OF SELECTOR SECTION IN
SCAN FLIP-FLOP CIRCUIT OF FIG.6

FIG.8 USAGE EXAMPLE : BOTH SCAN FLIP-FLOP CIRCUIT OF FIG.6 AND CONVENTIONAL SCAN FLIP-FLOP CIRCUIT ARE USED IN INTEGRATED CIRCUIT

EXAMPLE OF CONVENTIONAL SCAN FLIP-FLOP CIRCUIT

USAGE EXAMPLE OF SCAN FLIP-FLOP CIRCUIT OF FIG.9

ANOTHER EXAMPLE OF CONVENTIONAL SCAN FLIP-FLOP CIRCUIT

USAGE EXAMPLE OF SCAN FLIP-FLOP CIRCUIT OF FIG.11

STRUCTURE EXAMPLE OF 2-TO-1 SELECTOR IN SCAN FLIP-FLOP CIRCUIT OF FIG.9 OR FIG.11

SCAN FLIP-FLOP CIRCUIT, SCAN FLIP-FLOP CIRCUIT ARRAY, AND INTEGRATED CIRCUIT DEVICE

CROSS-REFERENCE TO RELATED APPLICATIONS

This application is based upon and claims the benefit of priority from each of the prior Japanese Patent Application No. 2002-156225 filed on May 29, 2002, the entire contents of which are incorporated herein by reference.

BACKGROUND OF THE INVENTION

1. Field of the Invention

The present invention relates to a scan flip-flop circuit for making an integrated circuit device to perform one of two kinds of operations of a scan test carried out as a shipping inspection and a normal operation performed in a normal mode. More particularly, the invention relates to a scan flip-flop circuit achieving higher operation speed, lower power consumption, and a simplified selector portion, an array of the scan flip-flop circuits, and an integrated circuit device having therein the array.

2. Description of Related Art

FIG. 9 shows an example of the configuration of a conventional scan flip-flop circuit. A scan flip-flop circuit 80 shown in FIG. 9 has a 2-to-1 selector 82, a master latch 83, and a slave latch 84. The 2-to-1 selector 82 has an input terminal SI for receiving a scan-in signal, an input terminal D for receiving a data signal, and an input terminal SC for receiving a scan control signal. When a normal operation is instructed by the scan control signal SC, the data signal D is passed. When a scan test is instructed, the scan-in signal SI is passed. A clock signal CLK is input to the master latch 83 and the slave latch 84. With the configuration, the scan flip-flop circuit 80 latches an output signal d_int of the 2-to-1 selector 82 and outputs it from the output terminal Q synchronously with the clock CLK. A truth table of the scan flip-flop circuit 80 is as shown in Table 1.

TABLE 1

| INPUT | | | | OUTPUT | | |
|---|---|---|---|---|---|---|
| SC | SI | D | CLK | d_int | Q (,SO) | STATE |
| 0 | X | 0 | ↑ | 1(not_D) | D[n − 1] | NORMAL OPERATION |
|   |   | 1 | ↑ | 0(not_D) | D[n − 1] |   |
| 1 | 0 | X | ↑ | 1(not_SI) | SI[n − 1] | SCAN TEST |
|   | 1 |   | ↑ | 0(not_SI) | SI[n − 1] |   |

FIG. 10 shows a usage example of the scan flip-flop circuit 80 in an integrated circuit device. In the usage example of FIG. 10, a signal from the scan flip-flop circuit 80 to a logic circuit 90 and a signal from the scan flip-flop circuit 80 from a preceding stage to the scan flip-flop circuit 80 of the next stage are output from the same output terminal Q. Consequently, a net from the output terminal Q is branched, and one of the branches serves as the normal operation net 85 to the logic circuit 90 and the other branch serves as a scan net 86 to the input terminal SI of the scan flip-flop circuit 80 of the next stage.

FIG. 11 shows another example of the conventional scan flip-flop circuit. The different point between the scan flip-flop circuit 81 shown in FIG. 11 and the scan flip-flop circuit 80 is that an output terminal SO is provided in addition to the output terminal Q. The output terminal SO outputs the same signal as that from the output terminal Q and is used for connection to the scan flip-flop circuit of the next stage. Therefore, when the scan flip-flop circuit 81 is used, as shown in the usage example of FIG. 12, the normal operation net 85 and the scan net 86 are separated from each other.

FIG. 13 shows a structure example of the 2-to-1 selector 82 in the scan flip-flop circuit 80 or 81. The 2-to-1 selector 82 in FIG. 13 is constructed by total 10 transistors of PMOS transistors (hereinbelow, referred to as "MP") 11 to 15 and NMOS transistors (hereinbelow, referred to as "MN") 11 to 15. MP11 and the MN 11 are switched by the scan control signal SC and are connected in series between a power source line VDD and a grounding conductor GND. The two transistors construct an inverter for outputting an inversion signal SN of the scan control signal SC.

Between the power source line VDD and an output line d_int, MP12 and MP13 connected in series and MP14 and MP15 connected in series are provided in parallel. MP12 is switched by the signal of the input terminal D, MP13 is switched by the scan control signal SC, MP14 is switched by the signal of the input terminal SI, and MP15 is switched by the inversion signal SN. Between the output line d_int and the grounding conductor GND, MN12 and MN13 connected in series and MN14 and MN15 connected in series are provided in parallel. MN12 is switched by the signal of the input terminal D, MN13 is switched by the inversion signal SN, MN14 is switched by the signal of the input terminal SI, and MN15 is switched by the scan control signal SC. With the configuration, when the scan control signal SC is 0 (normal operation), the output signal d_int is determined by the data signal D irrespective of the signal of the input terminal SI. When the scan control signal SC is 1 (scan test), the output signal d_int is determined by the scan-in signal SI irrespective of the signal of the input terminal D.

The conventional scan flip-flop circuit, however, has the following problems. First, the circuit shown in FIGS. 9 and 10 has a problem that propagation delay time is long. For example, in the normal operation, at the time of transmitting a data signal from the output terminal Q to the logic circuit 90, the scan net 86 branched from some midpoint becomes as a wiring load. Consequently, the operation speed of the integrated circuit device is slow, and power consumption is high. In the circuit of FIGS. 11 and 12, the scan net 86 does not become a wiring load in the normal operation. However, a drive circuit is necessary for each of the output terminals Q and SO. Since the output terminal SO performs the same operation as that of the output terminal Q in the normal operation, power consumption is high.

In any of the circuit of FIGS. 9 and 10 and the circuit of FIGS. 11 and 12, as the 2-to-1 selector 82, a complicated configuration as shown in FIG. 13 has to be used. The 2-to-1 selector 82 of FIG. 13 includes three pairs of transistors switched by the scan control signal SC or the inversion signal SN of the scan control signal SC so that redundancy is high. The reason why such a complicated configuration has to be used is that a signal input to the input terminal SI is inconstant even in the normal operation (in which the scan control signal SC is 0). Therefore, to prevent the output signal d_int in the normal operation from being influenced by the signal of the input terminal SI, the complicated configuration as shown in FIG. 13 is necessary.

SUMMARY OF THE INVENTION

The present invention has been achieved to solve the problems of the conventional scan flip-flop circuits. An object of the invention is to provide a scan flip-flop circuit achieving higher operation speed, lower power consumption, and a simplified selector portion, an array of the scan flip-flop circuits, and an integrated circuit device having therein the array.

A scan flip-flop circuit of the present invention directed to achieve the object, for receiving a first signal and a second signal, passing the first signal in a first operation, and passing the second signal in a second operation, includes: a selecting section having a first input terminal for receiving the first signal, a second input terminal for receiving the second signal, and a third input terminal for receiving a control signal instructing one of the first and second operations to be performed, for outputting a signal based on the first signal when the control signal instructs the first operation and outputting a signal based on the second signal when the control signal instructs the second operation; a latch section for latching a signal based on the output signal of the selecting section synchronously with a clock and outputting the signal; a first output terminal for outputting an output signal of the latch section; and a second output terminal provided separately from the first output terminal, for outputting a fixed signal in the first operation and outputting a signal based on the second signal in the second operation.

The selecting section has a 2-1 OR-AND-INVERTER configuration which outputs inversion of AND of an input signal to the second input terminal and OR of the input signal to the first input terminal and the input signal to the third input terminal. Alternatively, the selecting section has a 2-1 AND-OR-INVERTER configuration which outputs inversion of OR of an input signal to the second input terminal and the AND of the input signal to the first input terminal and an input signal to the third input terminal. The selecting section of the OR-AND-INVERTER configuration is used in the case where the second operation is instructed by the high level of the scan control signal and the first operation is instructed by the low level of the scan control signal. In contrast, the selecting section of the AND-OR-INVERTER configuration is used in the case where the first operation is instructed by the high level of the scan control signal and the second operation is instructed by the low level of the scan control signal.

In the scan flip-flop circuit, separately from the first output terminal, a second output terminal is provided. Consequently, a wire connected to the second output terminal does not become a load in the first operation. Therefore, the first operation can be performed at high speed. In the first operation, an output of the second output terminal is fixed. With the configuration, there are the following two advantages. Firstly, low power consumption is secured at the first operation. Secondly, as the selecting section, a relatively simple configuration such as the OR-AND-INVERTER configuration or the AND-OR-INVERTER configuration can be employed.

A scan flip-flop circuit array of the invention is constructed by a plurality of scan flip-flop circuits of the invention, a signal of a second output terminal of a scan flip-flop circuit of the preceding stage is input to a second input terminal of a scan flip-flop circuit of the next stage. An integrated circuit device of the invention has a scan flip-flop circuit array and a main operation circuit for receiving a first or second signal from the scan flip-flop circuit array.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Embodiments of the present invention will be described in detail hereinbelow with reference to the attached drawings. In the embodiments, the invention is applied to an integrated circuit device having a logic circuit as an actual operation circuit and a scan flip-flop circuit array for conducting a scan test as a shipping inspection.

[First Embodiment]

Figure 1:
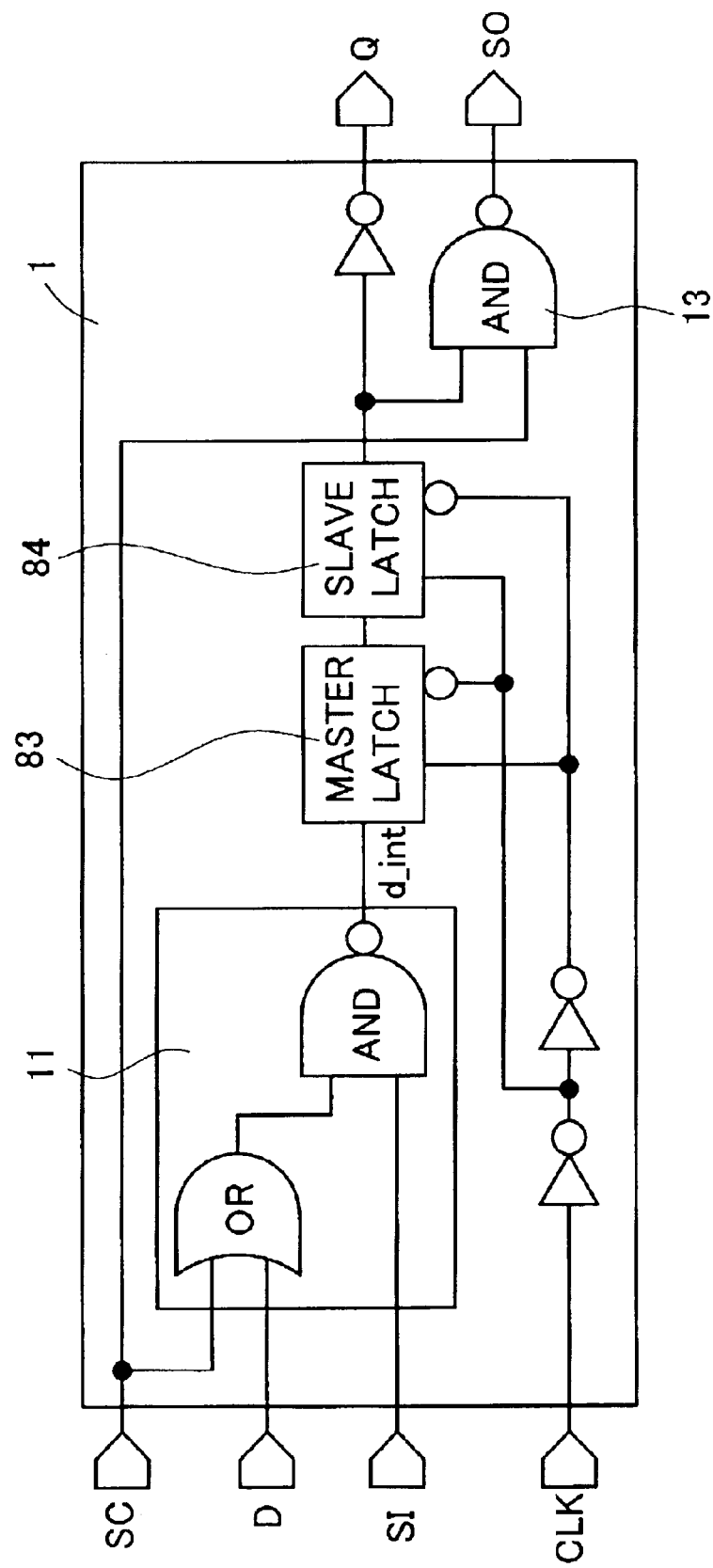
FIG. 1 is a block diagram showing a scan flip-flop circuit directed to a first embodiment.

A scan flip-flop circuit 1 according to a first embodiment is constructed as shown in the block diagram of FIG. 1. Specifically, the scan flip-flop circuit 1 has a selector section 11, a master latch 83, and a slave latch 84. The scan flip-flop circuit 1 is provided with, as external terminals, input terminals SC, D, and SI, a clock terminal CLK, and output terminals Q and SO. The input terminal SC is a terminal for receiving a scan control signal. The input terminal D is a terminal for receiving a data signal. The input terminal SI is a terminal for receiving a scan-in signal. The clock terminal CLK is a terminal for receiving a clock signal. The output terminal Q is a terminal for outputting a signal toward a logic circuit as an actual operation circuit of an integrated circuit device. The output terminal SO is a terminal for outputting a scan-in signal to a scan flip-flop circuit 1 of the next stage in a scan flip-flop circuit array.

Figure 2:
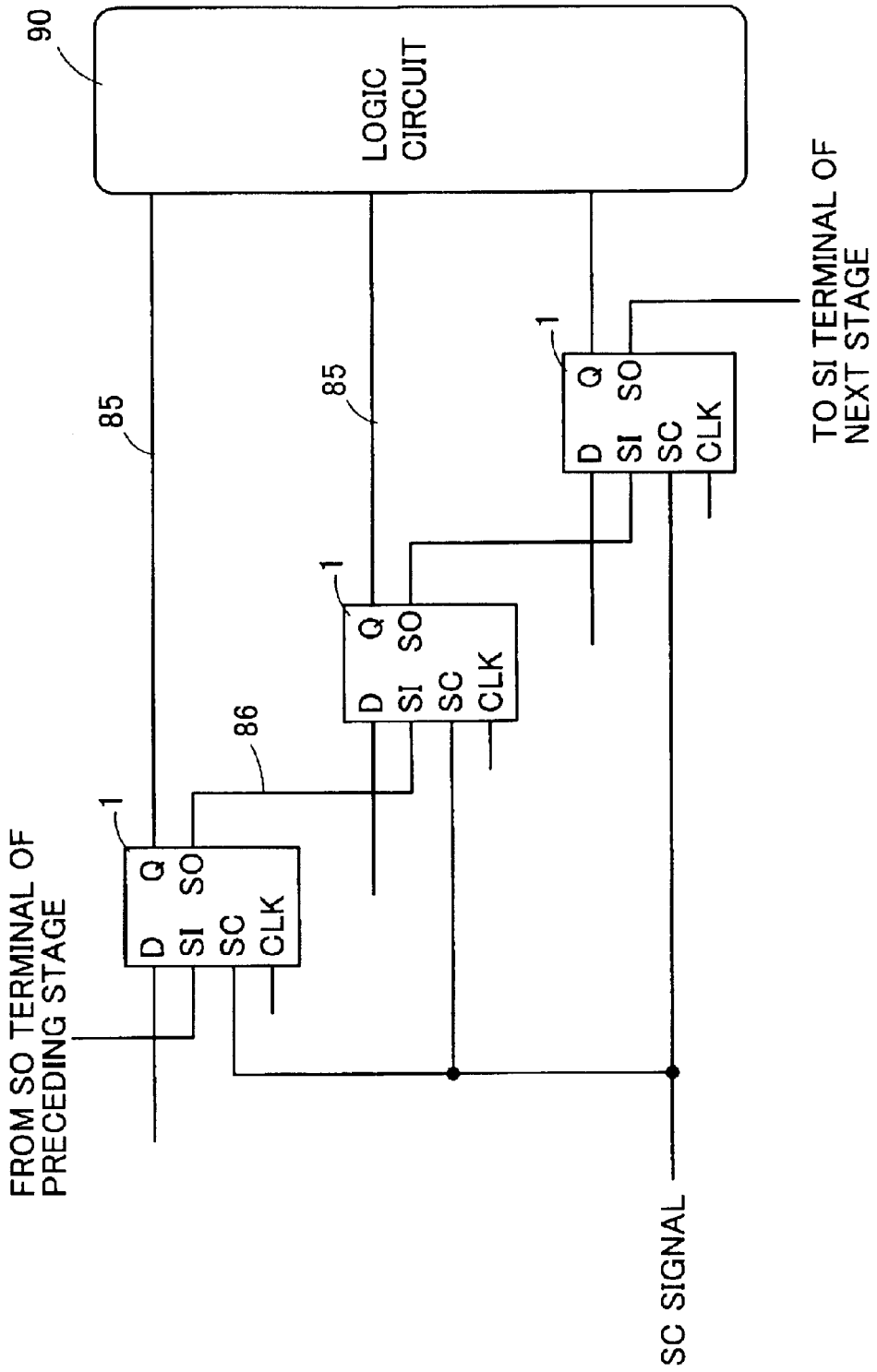
FIG. 2 is a block diagram showing a usage example of the scan flip-flop circuit of FIG. 1 in an integrated circuit device.

FIG. 2 shows a net connection configuration of a case where the scan flip-flop circuit 1 is used in an integrated circuit device. In the net connection configuration of FIG. 2, a number of scan flip-flop circuits 1 are connected like a chain, thereby forming a scan flip-flop circuit array. In the scan flip-flop circuit array, the output terminal SO of the scan flip-flop circuit 1 of the preceding stage and the input terminal SI of the scan flip-flop circuit 1 of the next stage are connected via the scan net 86. A common scan control signal SC is input to the input terminals SC of the scan flip-flop circuits 1. A data signal and a clock signal are input to each of the input terminals D and each of the clock terminals CLK, respectively, of the scan flip-flop circuits 1. A common clock signal may input to the scan flip-flop circuits 1. Further, the output terminals Q of the scan flip-flop circuits 1 and the logic circuit 90 are connected to each other via a drive net 85.

The selector section 11 in the scan flip-flop circuit 1 will be described. The selector section 11 is a logic circuit for receiving signals from the three input terminals SC, D, and SI and outputting an output signal d_int based on the three signals to the master latch 83. The selector section 11 basically has the structure of a 2-1 OR-AND-INVERTER for outputting an inversion of the AND between the signal of the input terminal SI and the OR of the scan control signal SC and the signal of the input terminal D.

Figure 3:
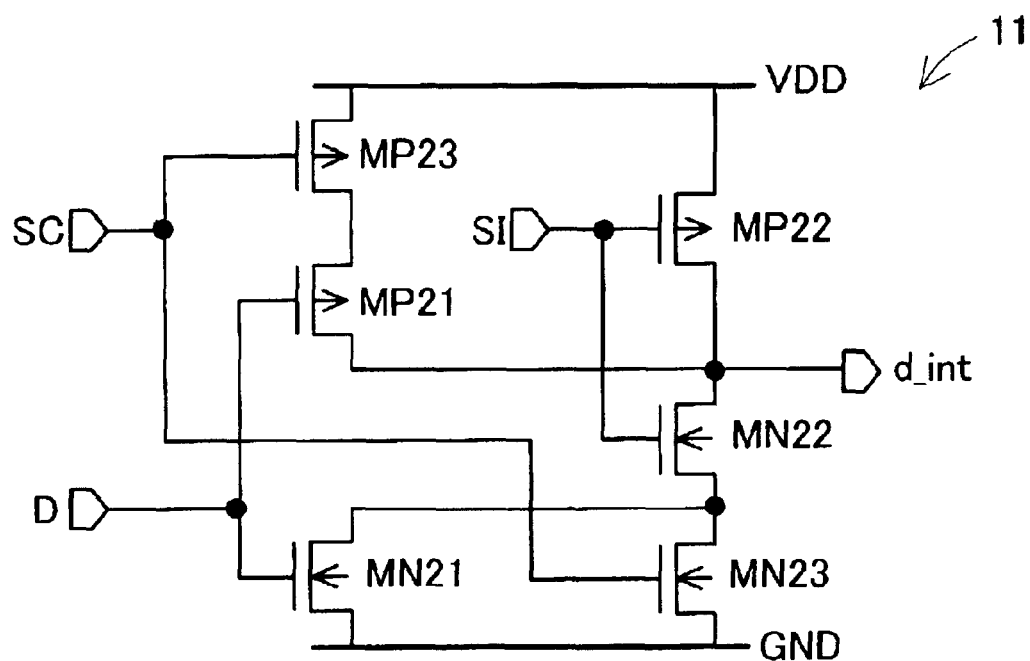
FIG. 3 is a circuit diagram showing the structure of a selector section in the scan flip-flop circuit of FIG. 1.

The selector section 11 is constructed as shown in the circuit diagram of FIG. 3. Specifically, the selector section 11 is constructed by total six transistors of three PMOS transistors MP21 to MP23 and three NMOS transistors MN21 to MN23. MP23 (third device) and MN23 (sixth device) are switched by the scan control signal SC. MP21 (first device) and MN21 (fourth device) are switched by the signal of the input terminal D. MP22 (second device) and MN22 (fifth device) are switched by the signal of the input terminal SI. MP21 and MP23 which are connected in series and MP 22 are disposed in parallel between the power source line VDD and the output line d_int. MN21 and MN23 which are connected in parallel and MN22 are connected in series between the output line d_int and the ground conductor GND. With the configuration, the selector section acts as the OR-AND-INVERTER.

The master latch 83 and the slave latch 84 will now be described. To the master latch 83 and the slave latch 84, clock signals are supplied from the clock terminal CLK. To the master latch 83, the output signal d_int of the selector section 11 is input. To the slave latch 84, the output terminals Q and SO are connected. The master latch 83 and the slave latch 84 latch the output signal d_int of the selector section 11 synchronously with the clock signal CLK and outputs it to the output terminals Q and SO. Since the latching operation is a known technique, its description will not be given.

The output terminal Q is a terminal for inverting an output signal of the slave latch 84 and outputting the inverted signal. The destination of the output is the logic circuit 90 as an actual operation circuit of the integrated circuit device. The output terminal SO is a terminal for outputting inversion of the AND of the output signal of the slave latch 84 and the scan control signal SC. Consequently, an NAND gate 13 is provided between the slave latch 84 and the output terminal SO. To the NAND gate 13, an output signal of the slave latch 84 and the scan control signal SC are input. The output destination of the output terminal SO is the input terminal SI of the scan flip-flop circuit 1 of the next stage in the scan flip-flop circuit array.

The operation of the scan flip-flop circuit 1 will be described. First, the operation of the selector section 11 will be described. The operation of the selector section 11 varies according to the scan control signal SC. The case where the scan control signal SC is low and the case where the scan control signal SC is high will be separately described.

First, the case where the scan control signal SC is low will be described. In this case, a signal of the input terminal SI is fixed at the high level for the following reason. When the scan control signal SC is low, in the circuit diagram of FIG. 3, MP23 is turned on and MN23 is turned off. Since the signal of the input terminal SI is high, MP22 is turned off and MN22 is turned on. Since MP23 is on and MP22 is off, whether the power source line VDD and the output line d_int are connected to each other or not depends on the state of MP21. Since MN23 is off and MN22 is on, whether the output line d_int and the ground conductor GND are connected to each other or not depends on the state of MN21. Consequently, the state of the output line d_int is determined according to the signal of the input terminal D. That is, when the signal of the input terminal D is high, the signal of the output line d_int becomes low because MP21 is off and MN21 is on. On the other hand, when the signal of the input terminal D is low, the signal of the output line d_int is high because MP21 is on and MN21 is off. That is, when the scan control signal SC is low, the selector section 11 outputs the inversion of the signal of the input terminal D.

The case where the scan control signal SC is high will now be described. In this case, there are no such constraints on the signal of the input terminal SI. When the scan control signal SC is high, MP23 is turned off and MN23 is turned on. Since MP23 is off, whether the power source line VDD and the output line d_int are connected to each other or not depends on the state of MP22 irrespective of the state of MP21. Since MN23 is on, whether the output line d_int and the ground conductor GND are connected to each other or not depends on the state of MN22 irrespective of the state of MN21. Consequently, the state of the output line d_int is determined by the signal of the input terminal SI. That is, when the signal of the input terminal SI is high, irrespective of the signal of the input terminal D, the signal of the output line d_int becomes low for the reason that MP22 is off and MN22 is on. On the other hand, when the signal of the input terminal SI is low, irrespective of the signal of the input terminal D, the signal of the output line d_int becomes high for the reason that MP22 is on and MN22 is off. That is, the selector section 11 outputs the inversion of the signal of the input terminal SI when the scan control signal SC is high.

The operation of the selector section 11 is equivalent to that of the OR-AND-INVERTER for the following reason. In the OR-AND-INVERTER in FIG. 1, when the scan control signal SC is low, the OR gate at the first stage passes the signal of the input terminal D as it is. At this time, since the signal of the input terminal SI is fixed at the high level, the AND gate of the second stage passes the output signal of the OR gate, that is, the signal of the input terminal D as it is. The inversion signal of the signal is output to the output line d_int. On the other hand, when the scan control signal SC is high, the output of the OR gate at the first stage is fixed at the high level. Consequently, the AND gate of the second stage passes the signal of the input terminal SI as it is. The inversion signal of the signal is output to the output line d_int.

In the above operation, an output of the selector section 11 is latched by the master latch 83 and the slave latch 84 synchronously with the clock signal CLK and is output. The inversion signal of the output of the slave latch 84 is output from the output terminal Q. Therefore, when the scan control signal SC is low, the signal of the input terminal D is passed to the output terminal Q. When the scan control signal SC is high, the signal of the input terminal SI is passed. The signal is output from the output terminal Q to the logic circuit 90.

An output signal of the slave latch 84 is also input to the NAND gate 13. To the NAND gate 13, not only the output signal of the slave latch 84 but also the scan control signal SC are input. Consequently, when the scan control signal SC is low, the output of the NAND gate 13 is fixed at the high level. When the scan control signal SC is high, the output of the NAND gate 13 is the inversion signal of the output of the slave latch 84 in a manner similar to the output terminal Q. An output of the NAND gate 13 becomes an output signal of the output terminal SO. Therefore, when the scan control signal SC is high, the signal of the input terminal SI is passed to the output terminal SO. However, when the scan control signal SC is low, an output of the output terminal SO is fixed at the high level. Such an output is sent from the output terminal SO to the input terminal SI of the scan flip-flop circuit 1 of the next stage. This accounts for the operation of the selector section 11 described above such that when the scan control signal SC is low, the signal of the input terminal SI is fixed at the high level.

Table 2 shows truth values of signals of the above-described sections. "x" marked in the signal of the input terminal D when the scan control signal SC is high denotes that whether the signal is high or low, no influence is exerted on the result.

Figure 13:
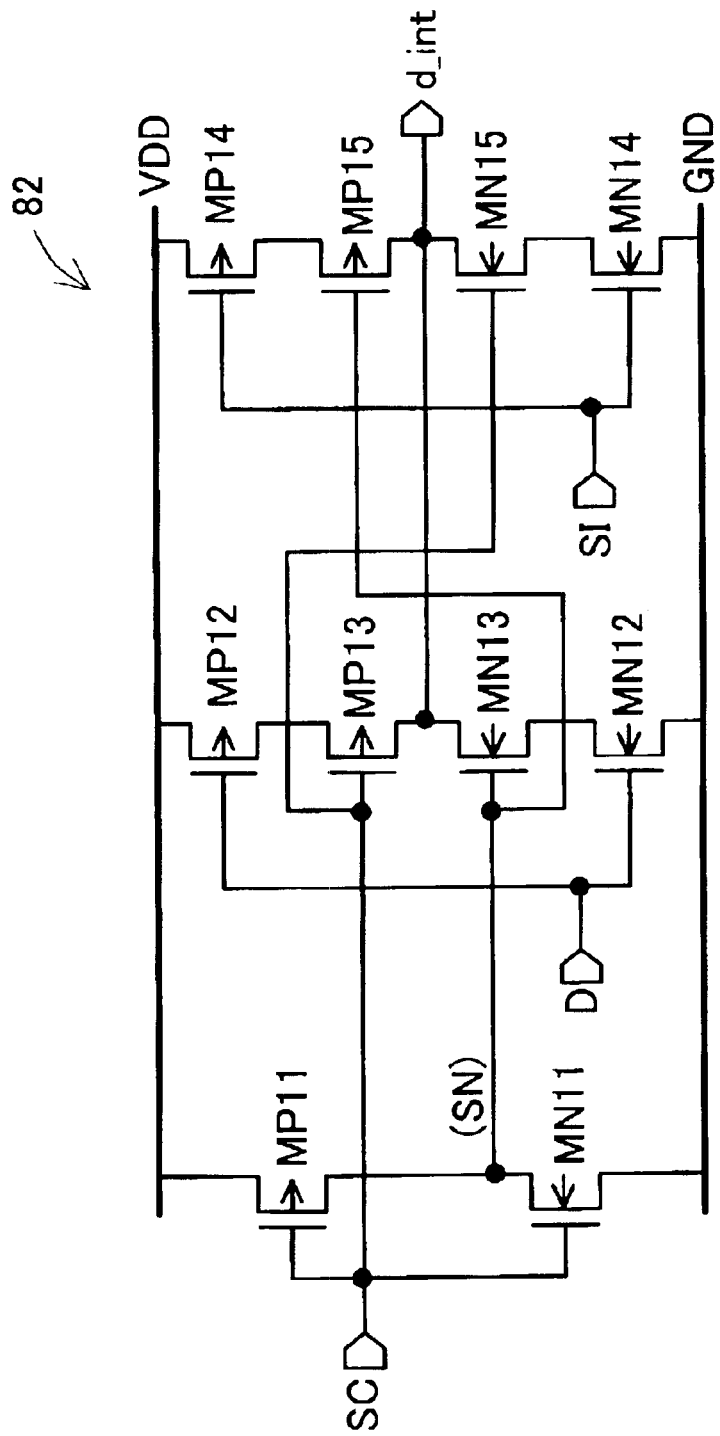
FIG. 13 is a circuit diagram showing an example of the structure of a 2-to-1 selector in the scan flip-flop circuit of FIG. 9 or FIG. 11.

Conventionally, to perform accurate operation even in such a state, a 2-to-1 selector having a complicated configuration as shown in FIG. 13 is indispensable. Since the output of the output terminal SO is fixed during the normal operation in the scan flip-flop circuit 1 of the embodiment, the selector section 11 having a relatively simple configuration shown in FIG. 3 can be employed. In the selector section 11, only the pair of devices (MP23 and MN23) switched by the scan control signal SC, the pair of devices (MP21 and MN21) switched by the signal of the input terminal D, and the pair of devices (MP22 and MN22) switched by the input terminal SI exist. Consequently, there is no redundancy.

On the other hand, the state where the scan control signal SC is high denotes a state where a scan test of an integrated circuit is conducted. In this state, the inversion signal of the scan-in signal SI input to the input terminal SI is output from the selector section 11 (d_int). The inversion signal is passed through the master latch 83 and the slave latch 84 and, after that, inverted again. The resultant signal is output from the output terminal Q to the logic circuit 90. That is, the scan-in signal SI is input to the logic circuit 90. During the scan test, the scan control signal SC which is high is input to one of the input terminals of the NAND gate 13. Consequently, the NAND gate 13 outputs the inversion signal of the output signal of the slave latch 84. This is the scan-in signal SI like the signal of the output terminal Q. The

TABLE 2

| INPUT | | | | OUTPUT | | | |
|---|---|---|---|---|---|---|---|
| SC | SI | D | CLK | d_int | Q | SO | STATE |
| 0 | 1(FIXED) | 0 | ↑ | 1(not_D) | D[n − 1] | 1(FIXED) | NORMAL OPERATION |
|  |  | 1 | ↑ | 0(not_D) | D[n − 1] |  |  |
| 1 | 0 | X | ↑ | 1(not_SI) | SI[n − 1] | SI[n − 1] | SCAN TEST |
|  | 1 |  | ↑ | 0(not_SI) | SI[n − 1] | SI[n − 1] |  |

The state where the scan control signal SC is low in the scan flip-flop circuit 1 denotes a state where the logic circuit 90 in the integrated circuit is made to perform a normal operation. In this state, the inversion signal of the data signal D input to the input terminal D is output from the selector section 11 (d_int). The signal passes through the master latch 83 and slave latch 84 and is again inverted. The inversion signal is output from the output terminal Q to the logic circuit 90. That is, the data signal D is input to the logic circuit 90. In such a manner, the normal operation is performed. In the normal operation, the scan net 86 does not become a wiring load at the time of transmitting the data signal D to the logic circuit 90. By providing the output terminal SO in addition to the output terminal Q, the scan net 86 and the drive net 85 are completely separated from each other. Consequently, the scan net 86 is not a factor of deteriorating the operation speed of the normal operation.

During the normal operation, the level of the scan net 86 is maintained constant (high) irrespective of fluctuation of the data signal D, so that excessive power is not consumed. The operation of the selector section 11 is not disturbed since the input signal to the scan-in terminal SI is fixed at the high level. If the signal of the scan-in terminal SI fluctuates according to the data signal D, the selector section 11 does not perform an intended operation. That is, when the signal of the scan-in terminal SI goes low, the output signal d_int of the selector section 11 is fixed at the high level. In such a state, the data signal D cannot be sent to the logic circuit 90 and the normal operation cannot be performed.

signal is transmitted from the output terminal SO to the scan flip-flop circuit 1 of the next stage. In such a manner, the scan test is conducted.

Figure 4:
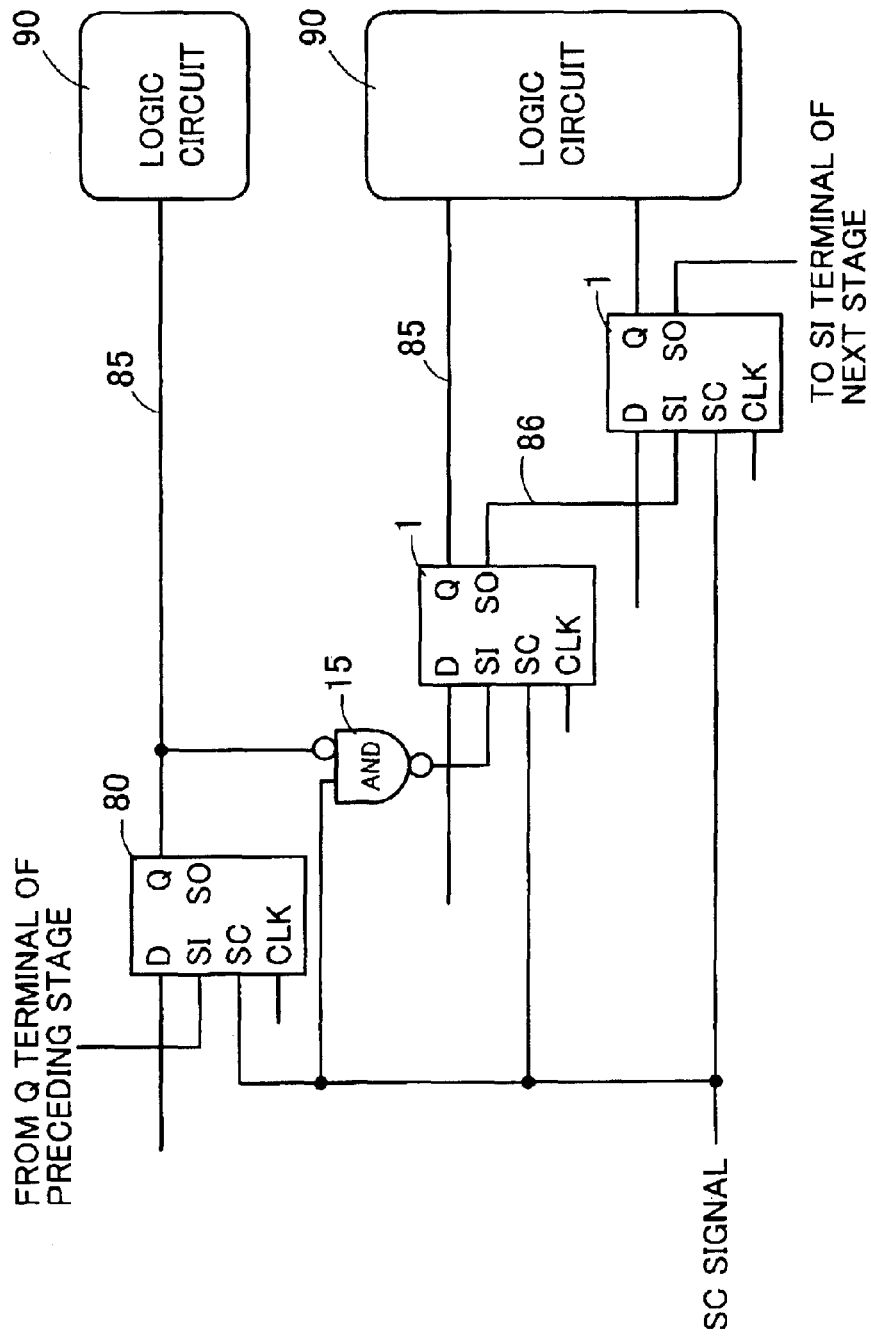
FIG. 4 is a block diagram showing an example (1) of using both the scan flip-flop circuit of FIG. 1 and a conventional scan flip-flop circuit in an integrated circuit device.
Figure 5:
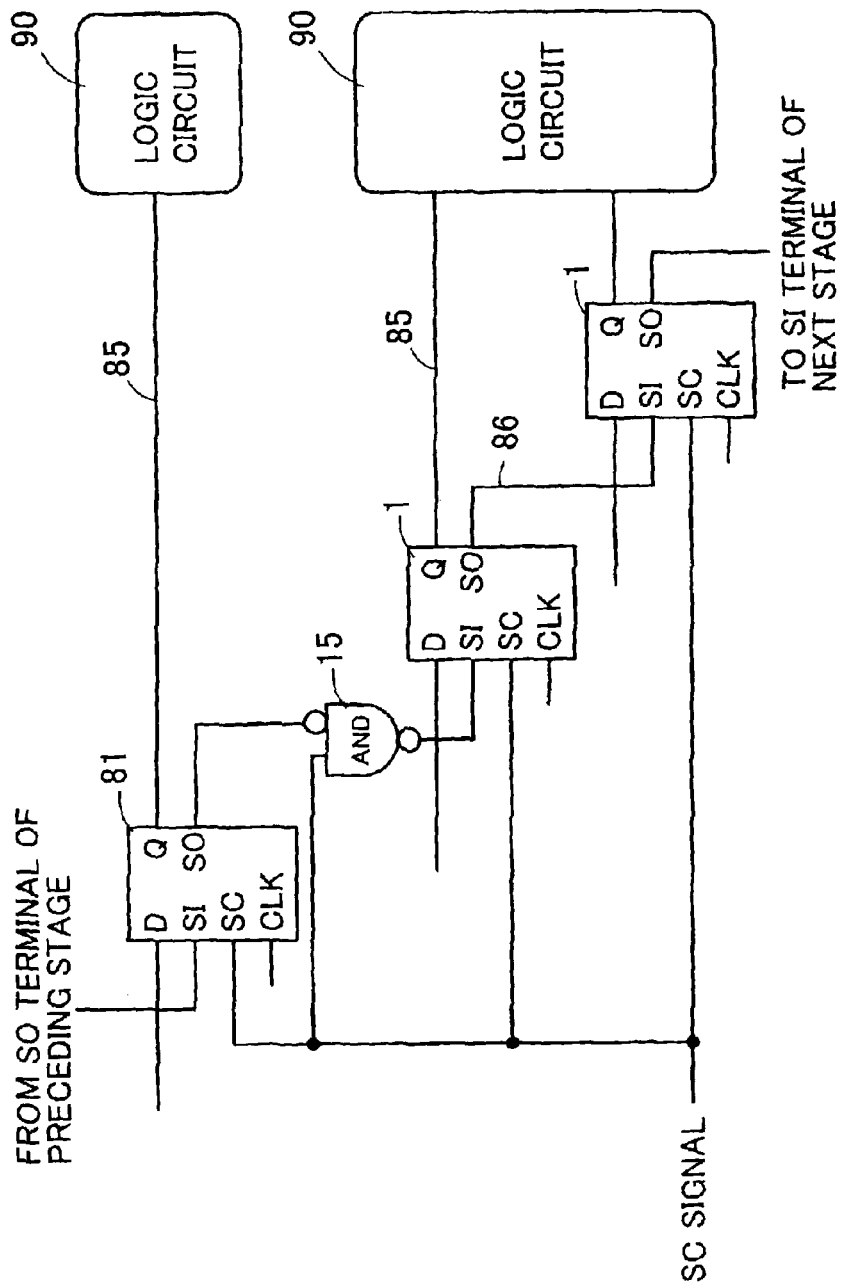
FIG. 5 is a block diagram showing an example (2) of using both the scan flip-flop circuit of FIG. 1 and a conventional scan flip-flop circuit in an integrated circuit device.
Figure 9:
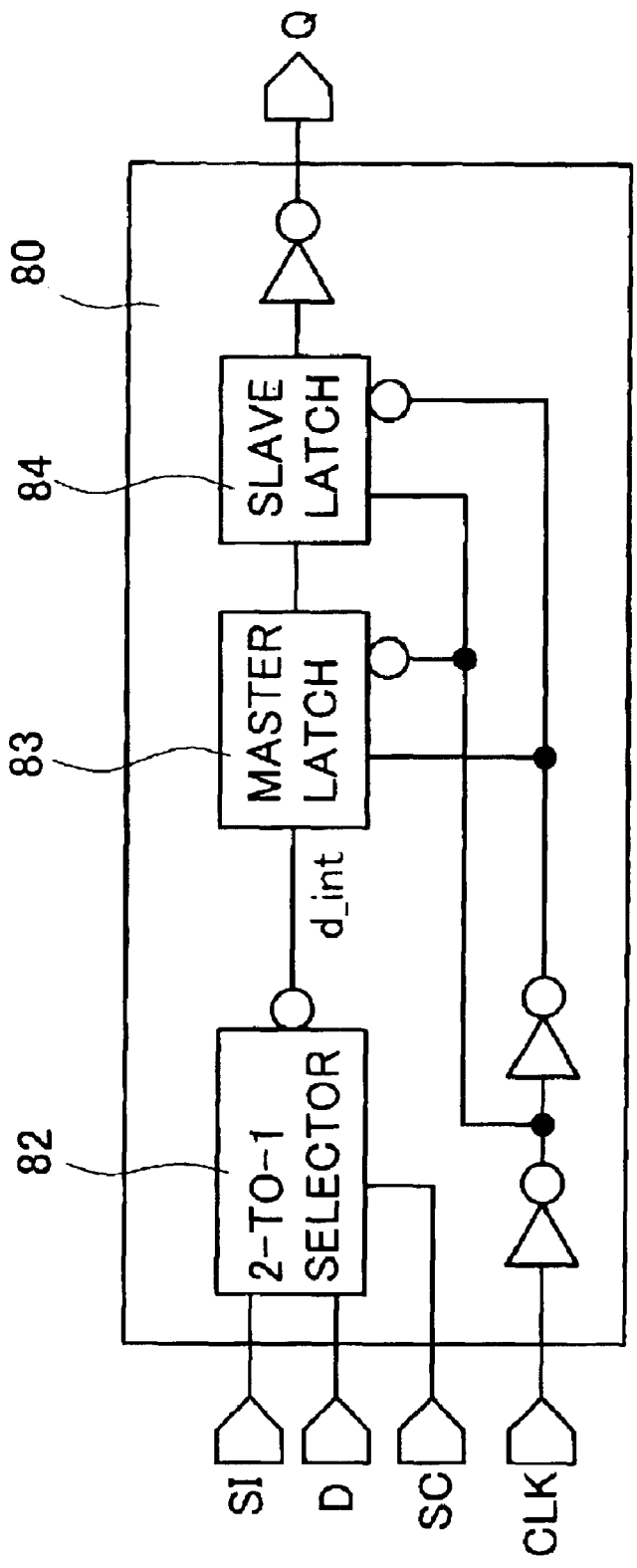
FIG. 9 is a block diagram showing an example of a conventional scan flip-flop circuit.
Figure 10:
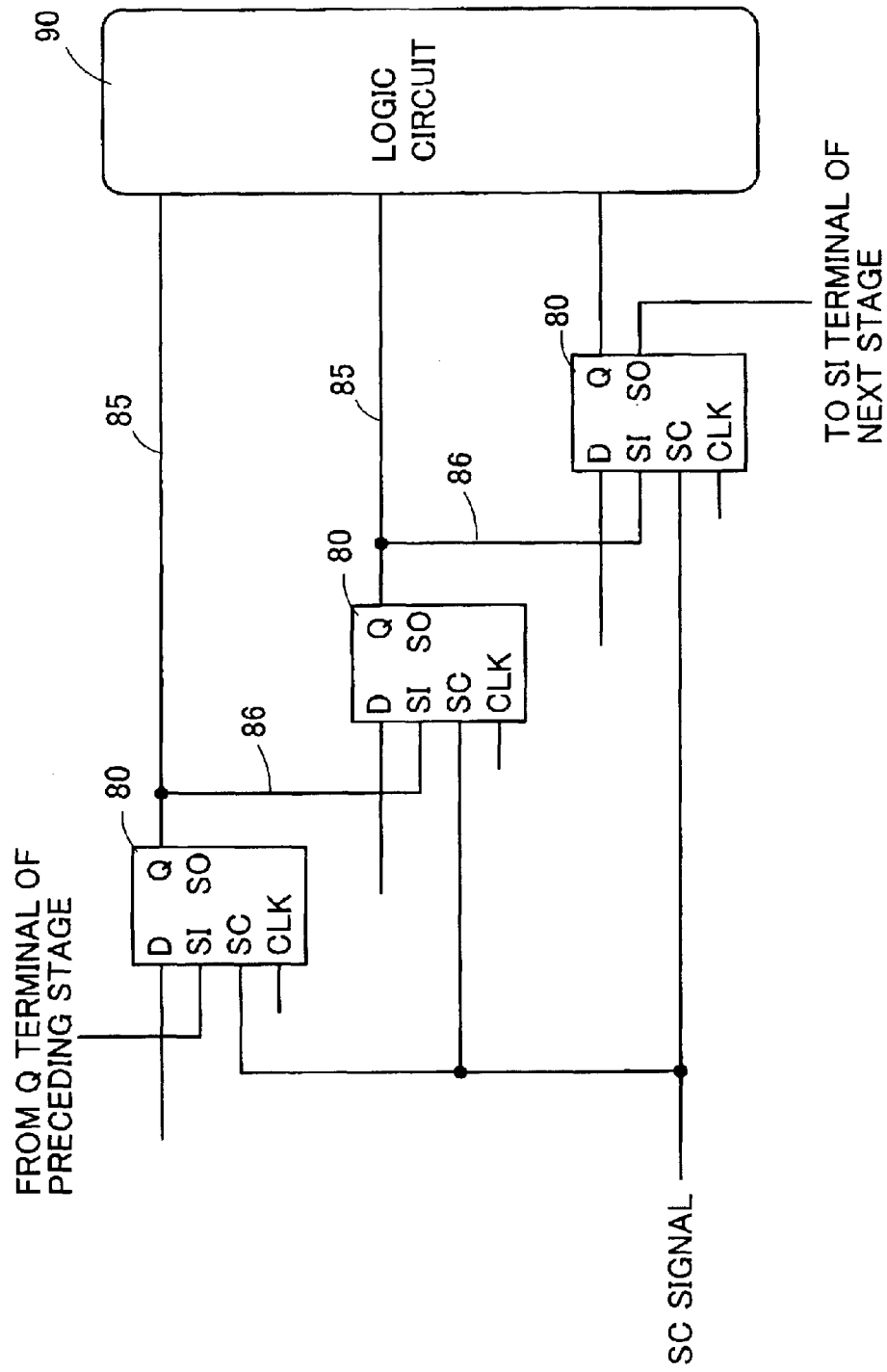
FIG. 10 is a block diagram showing a usage example of the scan flip-flop circuit of FIG. 9.
Figure 11:
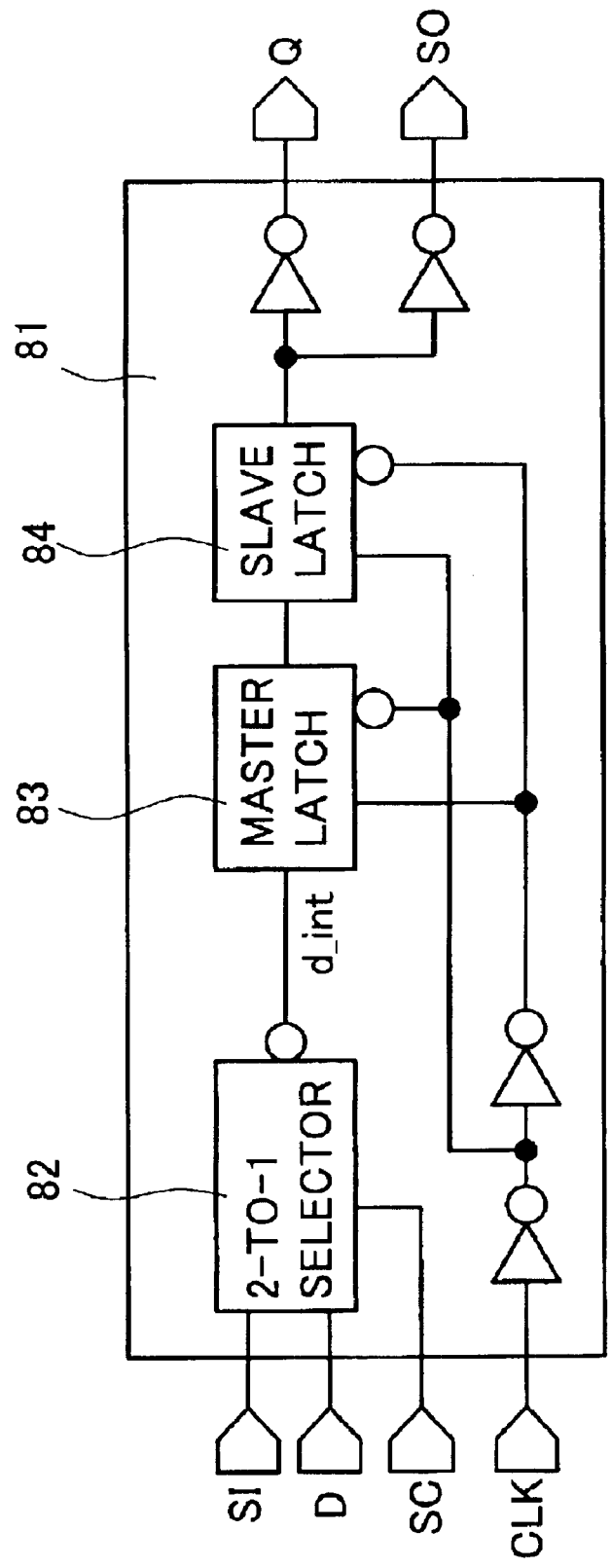
FIG. 11 is a block diagram showing another example of a conventional scan flip-flop circuit.
Figure 12:
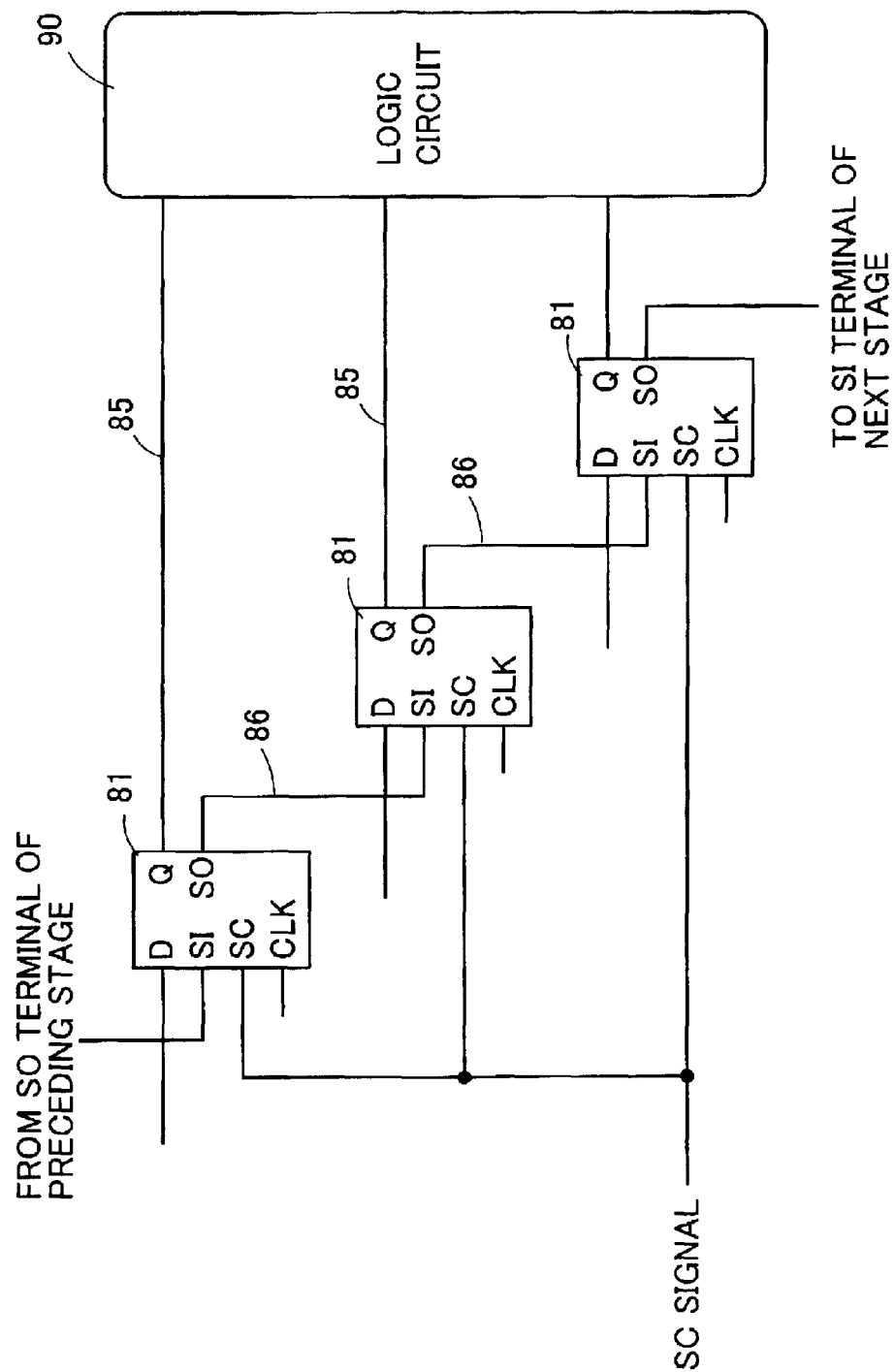
FIG. 12 is a block diagram showing an usage example of the scan flip-flop circuit of FIG. 11.

The scan flip-flop circuit 1 and a conventional scan flip-flop circuit can form a scan flip-flop circuit array in an integrated circuit device. FIGS. 4 and 5 show the example. FIG. 4 shows an example using the scan flip-flop circuit 80 shown in FIG. 9 as a conventional scan flip-flop circuit. FIG. 5 shows an example using a scan flip-flop circuit 81 shown in FIG. 11 as a conventional scan flip-flop circuit. The usage examples are the same as the above with respect to the point that the scan flip-flop circuits 1 are successively arranged.

However, in a portion where the scan flip-flop circuit 1 is disposed immediately after each of the scan flip-flop circuits 80 and 81, an NAND gate 15 has to be interposed. Specifically, to the NAND gate 15, the inversion signal of one of the outputs of the output terminals Q or SO of the scan flip-flop circuits 80 and 81 at the preceding stage and the scan control signal SC are input. An output of the NAND gate 15 is input to the input terminal SI of the scan flip-flop circuit 1 of the next stage. The reason why the NAND gate 15 is interposed is that the output of one of the output terminals Q or SO of the scan flip-flop circuits 80 and 81 is not fixed in the normal operation. Consequently, if the output of each of the output terminals Q or SO of the scan flip-flop circuits 80 and 81 is directly input to the input terminal SI of the scan flip-flop circuit 1 of the next stage, the scan flip-flop circuit 1 of the next stage does not operate accurately in the normal operation. In the examples of FIGS.

4 and 5, by providing the NAND gate 15, an input signal to the input terminal SI of the scan flip-flop circuit 1 of the next stage is fixed to the high level in the normal operation. It makes the scan flip-flop circuit 1 of the next stage operate accurately also in the normal operation.

Although not shown in FIGS. 4 and 5, such a scheme is unnecessary for the portion where the scan flip-flop circuit 80 or 81 is disposed immediately after the scan flip-flop circuit 1. In other words, it is sufficient to connect the output terminal SO (or output terminal Q) of the scan flip-flop circuit 1 of the preceding stage directly to the input terminal SI of the scan flip-flop circuit 80 or 81 of the next stage.

As described in detail above, in the embodiment, the scan flip-flop circuit 1 is provided with the output terminal SO in addition to the output terminal Q. One of the output terminals is used for the logic circuit 90 and the other output terminal is used for the scan flip-flop circuit 1 of the next stage. At the output terminal SO for the scan flip-flop circuit 1 of the next stage, an output is fixed in the normal operation. In such a manner, higher operation speed in the normal operation and lower power consumption is achieved. The selector section 11 employs the relatively simple OR-AND-INVERTER structure. In the case of using the conventional scan flip-flop circuit 80 or 81 as well, it is sufficient to interpose the NAND gate 15.

[Second Embodiment]

In a second embodiment, the present invention is applied to an integrated circuit device in which, different from the first embodiment, the normal operation is performed when the scan control signal SC is high and a scan test is conducted when the scan control signal SC is low.

Figure 6:
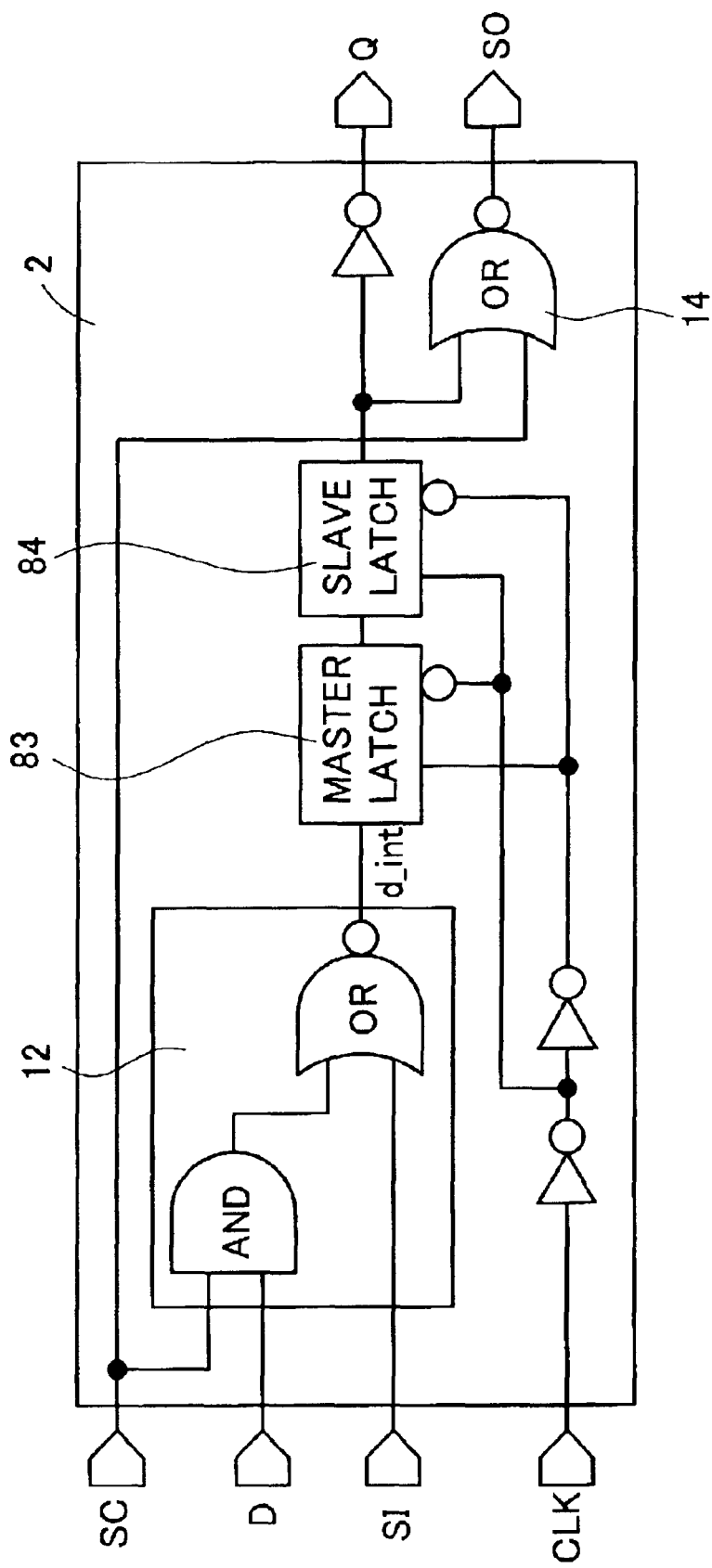
FIG. 6 is a block diagram showing a scan flip-flop circuit directed to a second embodiment.

The scan flip-flop circuit 2 according to the second embodiment is constructed as shown in the block diagram of FIG. 6. Specifically, the scan flip-flop circuit 2 has a selector section 12, the master latch 83, and the slave latch 84. The scan flip-flop circuit 2 is provided with, as external terminals, the input terminals SC, D, and SI, the clock terminal CLK, and the output terminals Q and SO. The input terminal SC is a terminal for receiving a scan control signal. The input terminal D is a terminal for receiving a data signal. The input terminal SI is a terminal for receiving a scan-in signal. The clock terminal CLK is a terminal for receiving a clock signal. The output terminal Q is a terminal for outputting a signal toward a logic circuit as an actual operation circuit of an integrated circuit device. The output terminal SO is a terminal for outputting a scan-in signal to a scan flip-flop circuit 2 of the next stage in a scan flip-flop circuit array.

The selector section 12 in the scan flip-flop circuit 2 will be described. The selector section 12 is a logic circuit for receiving signals from the three input terminals SC, D, and SI and outputting an output signal d_int based on the three signals to the master latch 83. The selector section 11 basically has the configuration of a 2-1 OR-AND-INVERTER for outputting the inversion of the OR between the AND of the scan control signal SC and the signal of the input terminal D and the signal of the input terminal SI.

Figure 7:
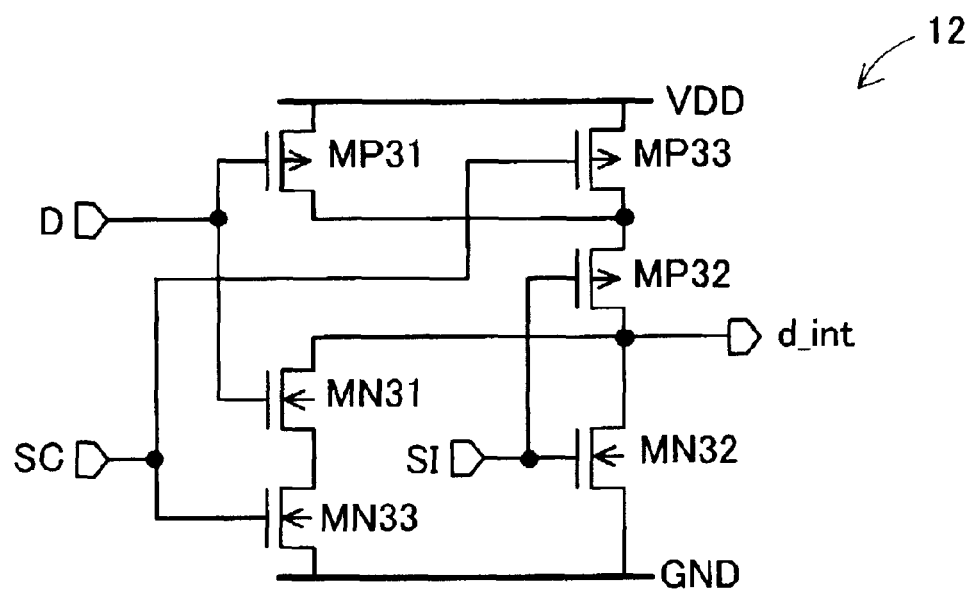
FIG. 7 is a circuit diagram showing the structure of a selector section in the scan flip-flop circuit of FIG. 6.

The selector section 12 is constructed as shown in the circuit diagram of FIG. 7. Specifically, the selector section 12 is constructed by total six transistors of three PMOS transistors MP31 to MP33 and three NMOS transistors MN31 to MN33. MP33 (third device) and MN33 (sixth device) are switched by the scan control signal SC. MP31 (first device) and MN31 (fourth device) are switched by the signal of the input terminal D. MP32 (second device) and MN32 (fifth device) are switched by the signal of the input terminal SI. MP31 and MP33 which are connected in parallel and MP32 are disposed in series between the power source line VDD and the output line d_int. MN31 and MN33 which are connected in series and MN32 are connected in parallel between the output line d_int and the ground conductor GND. With the configuration, the selector section acts as the AND-OR-INVERTER.

The output terminal Q is a terminal for inverting an output signal of the slave latch 84 and outputting the inverted signal. The destination of the output is the logic circuit 90 as an actual operation circuit of the integrated circuit device. The output terminal SO is a terminal for outputting inversion of the OR of the output signal of the slave latch 84 and the scan control signal SC. Consequently, an NOR gate 14 is provided between the slave latch 84 and the output terminal SO. To the NOR gate 14, an output signal of the slave latch 84 and the scan control signal SC are input. The output destination of the output terminal SO is the input terminal SI of the scan flip-flop circuit of the next stage in the scan flip-flop circuit array. Since the master latch 83 and the slave latch 84 are similar to those in the first embodiment, their description will not be repeated here.

The operation of the scan flip-flop circuit 2 will be described. First, the operation of the selector section 12 will be described. In a manner similar to the selector section 11 in the first embodiment, the operation of the selector section 12 varies according to the scan control signal SC. Therefore, the case where the scan control signal SC is high and the case where the scan control signal SC is low will be separately described.

First, the case where the scan control signal SC is high will be described. In this case, a signal of the input terminal SI is fixed at the low level for the following reason. When the scan control signal SC is high, in the circuit diagram of FIG. 7, MP33 is off and MN33 is on. Since the signal of the input terminal SI is low, MN32 is off and MP32 is on. Since MP32 is on and MP33, is off, whether the power source line VDD and the output line d_int are connected to each other or not depends on the state of MP31. Since MN32 is off and MN33 is on, whether the output line d_int and the ground conductor GND are connected to each other or not depends on the state of MN31. Consequently, the state of the output line d_int is determined according to the signal of the input terminal D. That is, when the signal of the input terminal D is high, the signal of the output line d_int becomes low because MP31 is off and MN31 is on. On the other hand, when the signal of the input terminal D is low, the signal of the output line d_int is high because MP31 is on and MN31 is off. That is, when the scan control signal SC is high, the selector section 12 outputs the inversion of the signal of the input terminal D.

The case where the scan control signal SC is low will now be described. In this case, there are no such constraints on the signal of the input terminal SI. When the scan control signal SC is low, MP33 is turned on and MN33 is turned off. Since MP33 is on, whether the power source line VDD and the output line d_int are connected to each other or not depends on the state of MP32 irrespective of the state of MP31. Since MN33 is off, whether the output line d_int and the ground conductor GND are connected to each other or not depends on the state of MN32 irrespective of the state of MN31. Consequently, the state of the output line d_int is determined by the signal of the input terminal SI. That is, when the signal of the input terminal SI is high, irrespective of the signal of the input terminal D, the signal of the output line d_int becomes low for the reason that MP32 is off and MN32 is on. On the other hand, when the signal of the input terminal SI is low, irrespective of the signal of the input terminal D, the signal of the output line d_int becomes high for the reason that MP32 is on and MN32 is off. That is, the selector section 12 outputs the inversion of the signal of the input terminal SI when the scan control signal SC is high.

The operation of the selector section 12 is equivalent to that of the AND-OR-INVERTER for the following reason. In the AND-OR-INVERTER in FIG. 6, when the scan control signal SC is high, the AND gate at the first stage passes the signal of the input terminal D as it is. At this time, since the signal of the input terminal SI is fixed at the low level, the OR gate of the second stage passes the output signal of the AND gate, that is, the signal of the input terminal D as it is. The inversion signal is output to the output line d_int. On the other hand, when the scan control signal SC is low, the output of the AND gate at the first stage is fixed at the low level. Consequently, the OR gate of the second stage passes the signal of the input terminal SI as it is. The inversion signal is output to the output line d_int.

In the above operation, an output of the selector section 12 is latched by the master latch 83 and the slave latch 84 synchronously with the clock signal CLK and is output. The inversion signal of the output of the slave latch 84 is output from the output terminal Q. Therefore, when the scan control signal SC is high, the signal of the input terminal D is passed to the output terminal Q. When the scan control signal SC is low, the signal of the input terminal SI is passed. Such a signal is output from the output terminal Q to the logic circuit 90.

An output signal of the slave latch 84 is also input to the NOR gate 14. To the NOR gate 14, not only the output signal of the slave latch 84 but also the scan control signal SC are input. Consequently, when the scan control signal SC is high, the output of the NOR gate 14 is fixed at the low level. When the scan control signal SC is low, the output of the NOR gate 14 is the inversion signal of the output of the slave latch 84 in a manner similar to the output terminal Q. An output of the NOR gate 14 becomes an output signal of the output terminal SO. Therefore, when the scan control signal SC is low, the signal of the input terminal SI is passed to the output terminal SO. However, when the scan control signal SC is high, an output of the output terminal SO is fixed at the low level. The output is sent from the output terminal SO to the input terminal SI of the scan flip-flop circuit 1 of the next stage. This accounts for the operation of the selector section 12 described above such that when the scan control signal SC is high, the signal of the input terminal SI is fixed at the low level.

Table 3 shows truth values of signals of the above-described sections. "x" marked in the signal of the input terminal D when the scan control signal SC is low denotes that whether the signal is high or low, no influence is exerted on the result.

The state where the scan control signal SC is high in the scan flip-flop circuit 2 denotes a state where the logic circuit 90 in the integrated circuit is allowed to perform a normal operation. In this state, the inversion signal of the data signal D input to the input terminal D is output from the selector section 12 (d_int). The signal passes through the master latch 83 and slave latch 84 and is again inverted. The inversion signal is output from the output terminal Q to the logic circuit 90. That is, the data signal D is input to the logic circuit 90. In such a manner, the normal operation is performed. In the normal operation, the scan net 86 does not become a wiring load at the time of transmitting the data signal D to the logic circuit 90. By providing the output terminal SO in addition to the output terminal Q, the scan net 86 and the drive net 85 are completely separated from each other. Consequently, the scan net 86 is not a factor of deteriorating the operation speed of the normal operation.

During the normal operation, the level of the scan net 86 is maintained constant (low) irrespective of fluctuation of the data signal D, so that excessive power is not consumed. The operation of the selector section 12 is not disturbed since the input signal to the scan-in terminal SI is fixed at the low level. If the signal of the scan-in terminal SI fluctuates according to the data signal D, the selector section 12 does not perform an intended operation. That is, when the signal of the scan-in terminal SI goes high, the output signal d_int of the selector section 12 is fixed at the low level. In such a state, the data signal D cannot be sent to the logic circuit 90 and the normal operation cannot be performed. Conventionally, to perform accurate operation even in such a state, a 2-to-1 selector having the complicated configuration as shown in FIG. 13 is indispensable. Since the output of the output terminal SO is fixed during the normal operation in the scan flip-flop circuit 2 of the embodiment, the selector section 12 having the relatively simple configuration shown in FIG. 7 can be employed.

On the other hand, the state where the scan control signal SC is low denotes a state where a scan test of an integrated circuit is conducted. In this state, the inversion signal of the scan-in signal SI input to the input terminal SI is output from the selector section 12 (d_int). The inversion signal is passed through the master latch 83 and the slave latch 84 and, after that, inverted again. The resultant signal is output from the output terminal Q to the logic circuit 90. That is, the scan-in signal SI is input to the logic circuit 90. During the scan test, the scan control signal SC which is low is input to one of the input terminals of the NOR gate 14. Consequently, the NOR gate 14 outputs the inversion signal of the output signal of the slave latch 84. This is the scan-in signal SI like the signal of the output terminal Q. The signal is transmitted from the output terminal SO to the scan flip-flop circuit 2 of the next stage. In such a manner, the scan test is conducted.

The scan flip-flop circuit 2 and a conventional scan flip-flop circuit can form a scan flip-flop circuit array in an

TABLE 3

Figure 8:
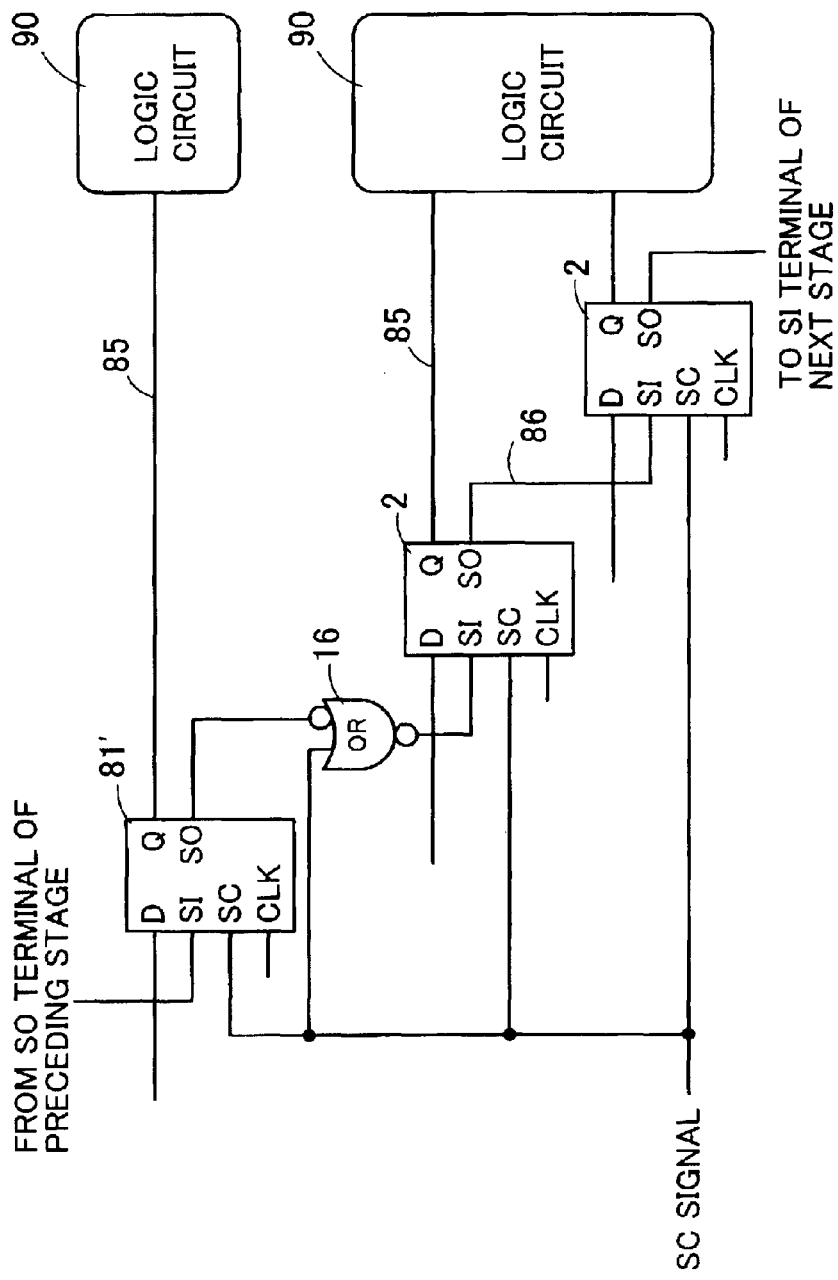
FIG. 8 is a block diagram showing an example of using both the scan flip-flop circuit in FIG. 6 and the conventional scan flip-flop circuit in an integrated circuit device.

| INPUT | | | | OUTPUT | | | |
|---|---|---|---|---|---|---|---|
| SC | SI | D | CLK | d_int | Q | SO | STATE |
| 0 | 0 | X | ↑ | 1(not_SI) | SI[n − 1] | SI[n − 1] | SCAN TEST |
|   | 1 |   | ↑ | 0(not_SI) | SI[n − 1] | SI[n − 1] |   |
| 1 | 0(FIXED) | 0 | ↑ | 1(not_D) | D[n − 1] | 0(FIXED) | NORMAL OPERATION |
|   |   | 1 | ↑ | 0(not_D) | D[n − 1] |   |   | integrated circuit device. FIG. 8 shows the example. FIG. 8 shows an example using a scan flip-flop circuit 81' as a conventional scan flip-flop circuit, obtained by changing the scan flip-flop circuit 81 shown in FIG. 11 so as to be applied to the case where the scan control signal SC in the normal operation is set to low and the scan control signal SC in the scan test is set to high. Although the output terminals Q and SO are separately used in the scan flip-flop circuit 81', they may be common. The usage examples are the same as the above with respect to the point that the scan flip-flop circuits 2 are successively arranged.

However, in a portion where the scan flip-flop circuit 2 is disposed immediately after the scan flip-flop circuit 81', an NOR gate 16 has to be interposed. Specifically, to the NOR gate 16, the inversion signals of the output of the output terminal SO or Q of the scan flip-flop circuit 81' at the preceding stage and the scan control signal SC are input. An output of the NOR gate 16 is input to the input terminal SI of the scan flip-flop circuit 2 of the next stage. The reason why the NOR gate 16 is interposed is that the output of the output terminal SO or Q of the scan flip-flop circuit 81' is not fixed in the normal operation. Consequently, if the output of the output terminal SO or Q of the scan flip-flop circuit 81' is directly input to the input terminal SI of the scan flip-flop circuit 2 of the next stage, the scan flip-flop circuit 2 of the next stage does not operate accurately in the normal operation. In the example of FIG. 8, by providing the NOR gate 16, an input signal to the input terminal SI of the scan flip-flop circuit 2 of the next stage is fixed at the low level in the normal operation. It makes the scan flip-flop circuit 2 of the next stage operate accurately even in the normal operation.

As described in detail above, in the embodiment, the scan flip-flop circuit 2 is provided with the output terminal SO in addition to the output terminal Q. One of the output terminals is used for the logic circuit 90 and the other output terminal is used for the scan flip-flop circuit 2 of the next stage. At the output terminal SO for the scan flip-flop circuit 2 of the next stage, an output is fixed in the normal operation. In such a manner, higher operation speed in the normal operation and lower power consumption is achieved. The selector section 12 can employ the relatively simple AND-OR-INVERTER structure. For combination with the conventional scan flip-flop circuit 81', it is sufficient to interpose the NOR gate 16.

The foregoing embodiments are just examples and do not limit the invention. Therefore, the invention can be naturally improved or modified without departing from the gist. For example, the invention can be applied not only to a logic IC as in the embodiments but also to a memory IC. The two kinds of operations are not limited to the scan test and the normal operation.

As obviously understood from the above description, according to the invention, the scan flip-flop circuit achieving higher operation speed, lower power consumption, and the simplified selector portion, an array of the scan flip-flop circuits, and an integrated circuit device having therein the array are provided. The scan flip-flop circuit can be combined with a conventional scan flip-flop circuit.

What is claimed is:

1. A scan flip-flop circuit for receiving a first signal and a second signal, passing the first signal in a first operation, and passing the second signal in a second operation, comprising:
   a selecting section having a first input terminal for receiving a first signal, a second input terminal for receiving a second signal, and a third input terminal for receiving a control signal instructing one of a first operation and a second operation to be performed, for outputting a signal based on the first signal when the control signal instructs a first operation and outputting a signal based on the second signal when the control signal instructs a second operation;
   a latch section for latching a signal based on an output signal of the selecting section synchronously with a clock and outputting the signal;
   a first output terminal for outputting an output signal of the latch section; and
   a second output terminal provided separately from the first output terminal, for outputting a fixed signal in a first operation and outputting a signal based on a second signal in a second operation,
   wherein the selecting section has a 2-1 OR-AND-INVERTER configuration which outputs inversion of AND of an input signal to the second input terminal and OR of the input signal to the first input terminal and the input signal to the third input terminal.

2. The scan flip-flop circuit according to claim 1, wherein the selecting section comprises:
   a first device which is turned off when an input signal to the first input terminal is high, and is turned on when the input signal is low;
   a second device which is turned off when an input signal to the second input terminal is high, and is turned on when the input signal is low;
   a third device which is turned off when an input signal to the third input terminal is high, and is turned on when the input signal is low;
   a fourth device which is turned on when an input signal to the first input terminal is high, and is turned off when the input signal is low;
   a fifth device which is turned on when an input signal to the second input terminal is high, and is turned off when the input terminal is low; and
   a sixth device which is turned on when an input signal to the third input terminal is high, and is turned off when the input signal is low,
   the first and third devices which are connected in series and the second device are disposed in parallel between the high side and the output side, and
   the fourth and sixth devices which are connected in parallel and the fifth device are disposed in series between the output side and the low side.

3. A scan flip-flop circuit for receiving a first signal and a second signal, passing the first signal in a first operation, and passing the second signal in a second operation, comprising:
   a selecting section having a first input terminal for receiving a first signal, a second input terminal for receiving a second signal, and a third input terminal for receiving a control signal instructing one of a first and second operations to be performed, for outputting a signal based on the first signal when the control signal instructs a first operation and outputting a signal based on the second signal when the control signal instructs a second operation;
   a latch section for latching a signal based on an output signal of the selecting section synchronously with a clock and outputting the signal;
   a first output terminal for outputting an output signal of the latch section; and
   a second output terminal provided separately from the first output terminal, for outputting a fixed signal in a first operation and outputting a signal based on a second signal in a second operation,
   wherein the selecting section has a 2-1 AND-OR-INVERTER configuration which outputs inversion of OR of an input signal to the second input terminal and the AND of the input signal to the first input terminal and an input signal to the third input terminal.

4. The scan flip-flop circuit according to claim 3, wherein the selecting section comprises:

a first device which is turned off when an input signal to the first input terminal is high, and is turned on when the input signal is low;

a second device which is turned off when an input signal to the second input terminal is high, and is turned on when the input signal is low;

a third device which is turned off when an input signal to the third input terminal is high, and is turned on when the input signal is low;

a fourth device which is turned on when an input signal to the first input terminal is high, and is turned off when the input signal is low;

a fifth device which is turned on when an input signal to the second input terminal is high, and is turned off when the input terminal is low; and a sixth device which is turned on when an input signal to the third input terminal is high, and is turned off when the input signal is low, the first and third devices which are connected in parallel and the second device are disposed in series between the high side and the output side, and the fourth and sixth devices which are connected in series and the fifth device are disposed in parallel between the output side and the low side.

5. The scan flip-flop circuit according to claim 1, wherein the first signal is a normal data signal, the second signal is a scan-in signal, the first operation is a normal operation, and the second operation is a scan test.

6. The scan flip-flop circuit according to claim 3, wherein the first signal is a normal data signal, the second signal is a scan-in signal, the first operation is a normal operation, and the second operation is a scan test.

7. A scan flip-flop circuit array having a plurality of scan flip-flop circuits each for receiving a first signal and a second signal, passing the first signal in a first operation, and passing the second signal in a second operation, wherein each of the scan flip-flop circuits comprises:

a selecting section having a first input terminal for receiving the first signal, a second input terminal for receiving the second signal, and a third input terminal for receiving a control signal instructing which one of the first and second operations to be performed, for outputting a signal based on the first signal when the control signal instructs the first operation and outputting a signal based on the second signal when the control signal instructs the second operation;

a latch section for latching a signal based on the output signal of the selecting section synchronously with a clock and outputting the signal;

a first output terminal for outputting an output signal of the latch section; and a second output terminal provided separately from the first output terminal, for outputting a fixed signal in the first operation and outputting a signal based on the second signal in the second operation, wherein the selecting section is a scan flip-flop circuit of a first kind having a 2-1 OR-AND-INVERTER configuration which outputs inversion of AND between the OR of the input signal to the first input terminal and the input signal to the third input terminal and the input signal to the second input terminal, and a signal of a second output terminal of a scan flip-flop circuit of the first kind of the preceding stage is input to a second input terminal of a scan flip-flop circuit of the next stage.

8. A scan flip-flop circuit array having a plurality of scan flip-flop circuits each for receiving a first signal and a second signal, passing the first signal in a first operation, and passing the second signal in a second operation, wherein each of the scan flip-flop circuits comprises:

a selecting section having a first input terminal for receiving the first signal, a second input terminal for receiving the second signal, and a third input terminal for receiving a control signal instructing which one of the first and second operations to be performed, for outputting a signal based on the first signal when the control signal instructs the first operation and outputting a signal based on the second signal when the control signal instructs the second operation;

a latch section for latching a signal based on the output signal of the selecting section synchronously with a clock and outputting the signal;

a first output terminal for outputting an output signal of the latch section; and a second output terminal provided separate from the first output terminal, for outputting a fixed signal in the first operation and outputting a signal based on the second signal in the second operation, wherein the selecting section is a scan flip-flop circuit of a first kind having a 2-1 AND-OR-INVERTER configuration which outputs inversion of OR between AND of the input signal to the first input terminal and the input signal to the third input terminal and the input signal to the second input terminal, and a signal of a second output terminal of the scan flip-flop circuit of the first kind of the preceding stage is input to a second input terminal of a scan flip-flop circuit of the first kind of the next stage.

9. The scan flip-flop circuit array according to claim 7, further comprising a scan flip-flop circuit of a second kind including:

a selecting section having a first input terminal for receiving the first signal, a second input terminal for receiving the second signal, and a third input terminal for receiving a control signal instructing which one of the first and second operations to be performed, for outputting a signal based on the first signal when the control signal instructs the first operation and outputting a signal based on the second signal when the control signal instructs the second operation;

a latch section for latching a signal based on the output signal of the selecting section synchronously with a clock and outputting the signal; and an output terminal for outputting an output signal of the latch section, wherein in a portion where the scan flip-flop circuit of the first kind is disposed subsequent to the scan flip-flop circuit of the second kind, a signal of an output terminal of the scan flip-flop circuit of the second kind is input to the second input terminal of the scan flip-flop circuit of the first kind via a logical operating device, and the logical operating device fixes an output value when the control signal is a signal instructing the first operation, and outputs a signal based on the signal of the output terminal of the scan flip-flop circuit of the second kind when the control signal is a signal instructing the second operation.

10. The scan flip-flop circuit array according to claim 8, further comprising a scan flip-flop circuit of a second kind including:

a selecting section having a first input terminal for receiving the first signal, a second input terminal for receiving the second signal, and a third input terminal for receiving a control signal instructing which one of the first and second operations to be performed, for outputting a signal based on the first signal when the control signal instructs the first operation and outputting a signal based on the second signal when the control signal instructs the second operation;

a latch section for latching a signal based on the output signal of the selecting section synchronously with a clock and outputting the signal; and an output terminal for outputting an output signal of the latch section, wherein in a portion where the scan flip-flop circuit of the first kind is disposed subsequent to the scan flip-flop circuit of the second kind, a signal of an output terminal of the scan flip-flop circuit of the second kind is input to the second input terminal of the scan flip-flop circuit of the first kind via a logical operating device, and the logical operating device fixes an output value when the control signal is a signal instructing the first operation, and outputs a signal based on the signal of the output terminal of the scan flip-flop circuit of the second kind when the control signal is a signal instructing the second operation.

11. The scan flip-flop circuit array according to claim 7, wherein the first signal is a normal data signal, the second signal is a scan-in signal, the first operation is a normal operation, and the second operation is a scan test.

12. The scan flip-flop circuit array according to claim 8, wherein the first signal is a normal data signal, the second signal is a scan-in signal, the first operation is a normal operation, and the second operation is a scan test.

13. An integrated circuit device comprising:

a scan flip-flop circuit array having a plurality of scan flip-flop circuits each for receiving a first signal and a second signal, passing the first signal in a first operation, and passing the second signal in a second operation; and a main operation circuit for receiving the first or second signal from the scan flip-flop circuit array, wherein each of the scan flip-flop circuits of the scan flip-flop circuit array includes:

a selecting section having a first input terminal for receiving the first signal, a second input terminal for receiving the second signal, and a third input terminal for receiving a control signal instructing which one of the first and second operations to be performed, for outputting a signal based on the first signal when the control signal instructs the first operation and outputting a signal based on the second signal when the control signal instructs the second operation;

a latch section for latching a signal based on the output signal of the selecting section synchronously with a clock and outputting the signal;

a first output terminal for outputting an output signal of the latch section; and a second terminal provided separate from the first output terminal, for outputting a fixed signal in the first operation and outputting a signal based on the second signal in the second operation, wherein the selecting section is a scan flip-flop circuit of a first kind having a 2-1 OR-AND-INVERTER configuration which outputs inversion of AND between OR of the input signal to the first input terminal and the input signal to the third input terminal and the input signal to the second input terminal, and in the scan flip-flop circuit array, a signal of a second output terminal of the scan flip-flop circuit of the first kind of the preceding stage is input to a second input terminal of the scan flip-flop circuit of the first kind of the next stage.

14. An integrated circuit device comprising:

a scan flip-flop circuit array having a plurality of scan flip-flop circuits each for receiving a first signal and a second signal, passing the first signal in a first operation, and passing the second signal in a second operation; and a main operation circuit for receiving the first or second signal from the scan flip-flop circuit array, wherein each of the scan flip-flop circuits of the scan flip-flop circuit array includes:

a selecting section having a first input terminal for receiving the first signal, a second input terminal for receiving the second signal, and a third input terminal for receiving a control signal instructing which one of the first and second operations to be performed, for outputting a signal based on the first signal when the control signal instructs the first operation and outputting a signal based on the second signal when the control signal instructs the second operation;

a latch section for latching a signal based on the output signal of the selecting section synchronously with a clock and outputting the signal;

a first output terminal for outputting an output signal of the latching section to the main operation circuit; and a second output terminal provided separate from the first output terminal, for outputting a fixed signal in the first operation and outputting a signal based on the second signal in the second operation, wherein the selecting section is a scan flip-flop circuit of a first kind having a 2-1 AND-OR-INVERTER configuration which outputs inversion of OR between AND of the input signal to the first input terminal and the input signal to the third input terminal and the input signal to the second input terminal, and in the scan flip-flop circuit array, a signal of a second output terminal of the scan flip-flop circuit of the first kind of the preceding stage is input to a second input terminal of a scan flip-flop circuit of the first kind of the next stage.

15. The integrated circuit device according to claim 13, wherein the scan flip-flop circuit array further comprises a scan flip-flop circuit of a second kind including:

a selecting section having a first input terminal for receiving the first signal, a second input terminal for receiving the second signal, and a third input terminal for receiving a control signal instructing which one of the first and second operations to be performed, for outputting a signal based on the first signal when the control signal instructs the first operation and outputting a signal based on the second signal when the control signal instructs the second operation;

a latch section for latching a signal based on the output signal of the selecting section synchronously with a clock and outputting the signal; and an output terminal for outputting an output signal of the latching section, wherein in a portion where the scan flip-flop circuit of the first kind is disposed subsequent to the scan flip-flop circuit of the second kind, a signal of an output terminal of the scan flip-flop circuit of the second kind is input to the second input terminal of the scan flip-flop circuit of the first kind via a logical operating device, and the logical operating device fixes an output value when the control signal is a signal instructing the first operation, and outputs a signal based on the signal of the output terminal of the scan flip-flop circuit of the second kind when the control signal is a signal instructing the second operation.

16. The integrated circuit device according to claim 14, wherein the scan flip-flop circuit array further comprises a scan flip-flop circuit of a second kind including:

a selecting section having a first input terminal for receiving the first signal, a second input terminal for receiving the second signal, and a third input terminal for receiving a control signal instructing which one of the first and second operations to be performed, for outputting a signal based on the first signal when the control signal instructs the first operation and outputting a signal based on the second signal when the control signal instructs the second operation;

a latch section for latching a signal based on the output signal of the selecting section synchronously with a clock and outputting the signal; and an output terminal for outputting an output signal of the latch section, wherein in a portion where the scan flip-flop circuit of the first kind is disposed subsequent to the scan flip-flop circuit of the second kind, a signal of an output terminal of the scan flip-flop circuit of the second kind is input to the second input terminal of the scan flip-flop circuit of the first kind via a logical operating device, and the logical operating device fixes an output value when the control signal is a signal instructing the first operation, and outputs a signal based on the signal of the output terminal of the scan flip-flop circuit of the second kind when the control signal is a signal instructing the second operation.

17. The integrated circuit device according to claim 13, wherein the first signal is a normal data signal, the second signal is a scan-in signal, the first operation is a normal operation, and the second operation is a scan test.

18. The integrated circuit device according to claim 14, wherein the first signal is a normal data signal, the second signal is a scan-in signal, the first operation is a normal operation, and the second operation is a scan test.

\* \* \* \* \*